United States Patent [19]

Anderson

[11] Patent Number: 4,565,922
[45] Date of Patent: Jan. 21, 1986

[54] KEY CARD APPARATUS

[75] Inventor: Eric G. Anderson, Rochester, Mich.

[73] Assignee: Rockwell International Corporation, Pittsburgh, Pa.

[21] Appl. No.: 496,044

[22] Filed: May 19, 1983

[51] Int. Cl.⁴ ............................................. G06K 19/06
[52] U.S. Cl. ..................................... 235/492; 235/487
[58] Field of Search ................................. 235/492, 487

[56] References Cited

U.S. PATENT DOCUMENTS 3,928,570 12/1975 Wolflingseder ...................... 235/492

FOREIGN PATENT DOCUMENTS 2509857 9/1976 Fed. Rep. of Germany ...... 235/492

Primary Examiner—Harold I. Pitts

[57] ABSTRACT

A series of first parallel printed contacts extends inward from a beveled first end of a card. Conductors extend over the surface on ends of the contact and are electrically connected together and with large contact terminals at the ends of the parallel series of contacts.

A second parallel series of contacts extends inward from the beveled first edge on the second side of the card, and conductors are looped around each other and individually terminate in a triangular array of connectors which extend through the card to make electrical contact with the first conductors on the first surface. Large end contact terminals are provided at ends of the second series of contact. Adhesive-backed covers cover the conductors and connectors and inner portions of the contacts and terminals.

The first conductors and second conductors are so arranged that large sections of each conductor in one group of conductors do not overlie conductors on the opposite side of the card. Holes can be punched through the card in selected locations to selectively interrupt conductors on one side of the card without interrupting conductors on the opposite side of the card.

16 Claims, 4 Drawing Figures

KEY CARD APPARATUS

BACKGROUND OF THE INVENTION

Key cards of varied form are widely used to insert in receivers which identify the cards to permit holders of cards to enter a premises, to enter data or to receive data or materials.

Many cards have electronic circuit elements embedded in the card or have magnetic information retained in the card or have some other form of identification.

Cards with magnetic storage of identification are susceptible to inadvertent change in the stored magnetic information, and data and cards having embedded circuit elements are relatively expensive and are difficult to produce and change and use.

The present invention overcomes problems which are inherent in the prior art.

SUMMARY OF THE INVENTION

The key card apparatus of the present invention uniquely provides a rugged card which is readily individualized and which is not susceptible to damage.

In a preferred form of the invention, a key card apparatus includes a circuit card stock having first and second sides and having first and second longitudinally extending edges and first and second opposite end edges. A first series of spaced contacts is mounted on the first side adjacent the first end edge and extends generally perpendicularly from the edge. A second series of spaced contacts is mounted on the second side near the first end edge and extends generally perpendicularly from the first end edge. A first series of conductors is connected to the first series of contacts and extends inward therefrom on the first side towards the second end edge. A second series of conductors is connected to the second series of contacts. The second series of conductors extends inward from the contacts on the second side of the card towards the second end edge and then extends across the card between the first and second longitudinal edges and then extends longitudinally on the card toward the first end edge. Connectors extend through the card from the first surface to the second surface for selectively connecting the first series of conductors to the second series of conductors. Means are provided for interrupting selected conductors. In the preferred key card apparatus, the first series of connectors are commonly connected together. The second series of connectors are separate from each other.

In a preferred embodiment, the second series of contacts is connected to the first series of contacts in reverse order. On contact in each series is not connected.

The preferred key card apparatus includes first spaced end contacts mounted at opposite ends of the first series of contacts, near respective first and second longitudinally extending edges and further includes longitudinally extending edge conductors extending along the longitudinally extending edges from the first spaced end contacts. The longitudinally extending edge conductors preferably are connected to the first series of conductors, and the longitudinally extending edge conductors are connected to each other. Preferably, second end contacts are positioned on the second side at ends of the second series of contacts, near the first and second longitudinally extending edges. The second end contacts are connected to the first end contacts by conductive means extending through the card from the first surface to the second surface.

In preferred configurations, the key card apparatus comprises a printed circuit card having first and second opposite surfaces, first and second spaced side edges and first and second spaced end edges. The first and second side edges are connected to the first end edge by bevels, generally perpendicular to the first and second surfaces. The first end edge is beveled inward from opposite surfaces to form a knife-like first edge. A first series of parallel contacts are connected to the first surface and extending perpendicularly inward thereon from adjacent the first end edge. First conductors are connected to inward extremities of the first contacts and extend inward on the first surface toward the first end edge. Means are provided for commonly connecting the first series of conductors together. Second contacts positioned on the second surface extend inward on the surface from adjacent the first end edge. Second conductors connected to the second contacts extend inward on the second surface toward the second end edge. Connectors extend through the key card from the first surface to the second surface and connect conductors on the first and second surfaces. First and second covers respectively positioned on the first and second surfaces cover the conductors and connectors and partially cover ends of the contacts remote from the first end edge.

The first series of conductors are commonly connected together by first and second longitudinally extending edge conductors that extend along the longitudinally extending edges. The longitudinally extending edge conductors are connected to each other.

In the preferred key card apparatus, portions of the first conductors are laterally offset from overlying portions of the second conductors on the second surface. Connectors extend through the card to selectively connect first conductors on the first side of the card with corresponding second conductors on the second side of the card. The second conductors are in opposite sequential order from the first conductors. Preferably, several of the conductors are interrupted by holes punched through the card and punched through the selected conductors. In one embodiment, holes are punched through the card in portions of the first conductors near the longitudinally extending edge conductors.

In preferred key card apparatus the connectors are arranged in a V-shaped array having an apex pointing toward the second end edge of the card.

DETAILED DESCRIPTION OF THE DRAWINGS

Figure 2:
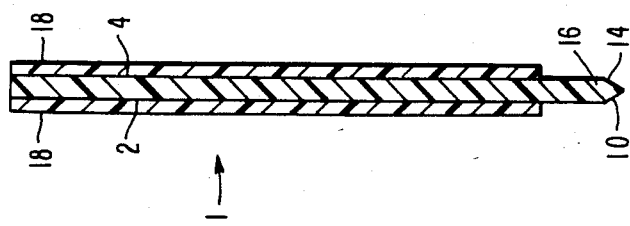
FIG. 2 is a partial side elevation of the key card shown in FIG. 1.

In the preferred form of the invention, as shown in the drawings, the card has an edge connector with a plurality of parallel contacts on both sides of the card. The card plugs into a data input module that reads both sets of contacts. Shorted conductors to the contacts at the edge connector are broken to give a code that can be read by a data input module. The unique edge connection enables rapid input and reading of a card and the unique positioning and breaking of the conductors provides easy and assured card individualization. The two sets of contacts, one on each side of the card at the edge connector, allows the card to be inserted and read by the data input module, either side up.

One use of the present card is to have a card which contains individualized information in the form of broken circuits which identifies a particular driver. The driver inserts the card into a receiver to record his identification and to activate circuits to record his identification and to accept other inputs, such as crossing state lines, refueling, or other events. Similar cards may be provided to specific locations to identify the locations, such as distribution points, store locations and gas stations, or others.

Figure 1:
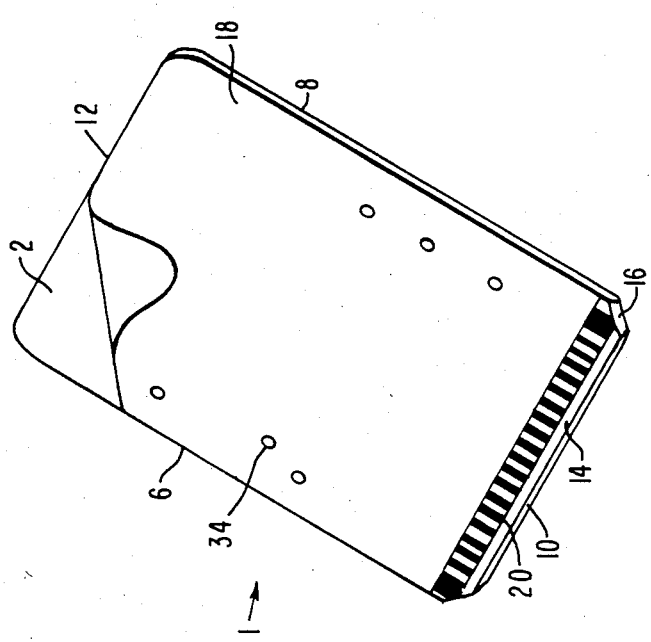
FIG. 1 is a perspective view of a preferred key card apparatus of the present invention.

Referring to FIG. 1, the card of the present invention is generally indicated by the numeral 1. The card has a first surface 2 and a second surface 4. First and second longitudinally extending edges 6 and 8 terminate in end edges 10 and 12. First end edge 10 is beveled 14 and edges are tapered 16 to allow the card to be inserted in a receiver with ease and without paying direct attention to the card.

The card has flexible adhesive label covers which are five mils thick to insulate the driver key conductors from contamination and water. Alternatively, the covers 18 may be formed of hard, plastic material to prevent access to the conductors and connectors.

Figure 3:
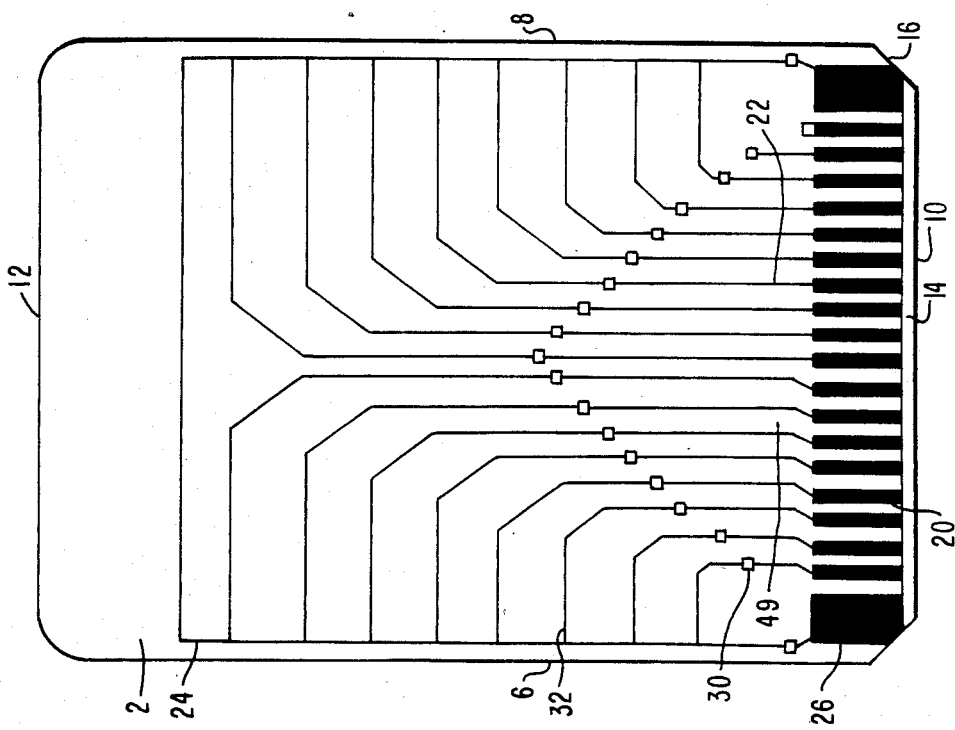
FIG. 3 shows the contacts, conductors and connectors on a first surface of the card shown in FIG. 1.

Referring to FIG. 3, a series of parallel contacts 20 are printed on the first surface 2 near first end edge 10. Conductors 22 lead away from the inner ends of the contacts 20 and are connected at remote ends to longitudinally extending edge conductors 24 leading from end terminal contacts 26. Connectors 30 extend through the card from the first surface 2 to the second surface 4 for connecting the first conductors 22 on the first surface 2 of the card with second conductors on the second surface of the card.

Portions 32 of the conductors 22 near the conductors 24 are widely spaced along the card to provide areas in which the conductors may be interrupted by punching holes 34 through the assembled key card, as shown in FIG. 1. Preferably, holes are punched through the peripheral area 36, either in side areas 38 or 39 to sever selected conductors for identification purposes. By choosing the numbers of holes and the particular conductors to be severed, $2^n$ identifications may be made from cards having n contacts on one side.

Figure 4:
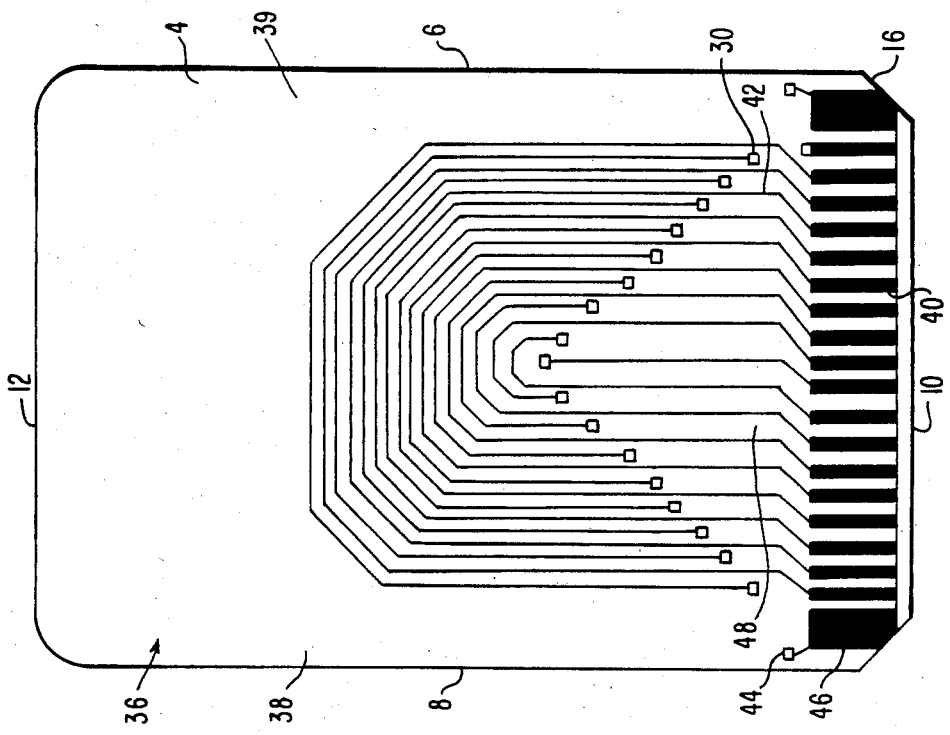
FIG. 4 shows the contacts, conductors and connectors of a second surface of the card.

As shown in FIG. 4, a series of contacts 40 is connected along edge 10 on the second surface 4 of the card. The connectors 42 are looped in a manner shown so that each contact in the series 40 is connected with its mirror image contact in series 20. Thus, the card is reversible. Edge 10 may be slid into the receiver with either side 2 or 4 of the card uppermost.

As shown in FIG. 4, each contact in series 40 is connected by an individual conductor 42 to an individual connector 30 in the V-shaped array of connectors, and terminal contacts 46 are connected by connectors 44 to end terminal contacts 26 on the opposite side of the card. In the triangular area 48 of surface 4 between the series of contacts 40 and the V-shaped array of connectors 30, conductors 42 are laterally offset from conductors 22 in area 49 of the first side 2 of the card so that each connector 30 connects only one conductor 22 with a single corresponding conductor 42.

In an alternate embodiment, the contacts, conductors, and connectors on the second surface 4 could all be eliminated so that there are contacts and conductors on the first surface 2 only. Such an arrangement would reduce cost and allow holes to be punched through conductors 22 at any point between contacts 20 and longitudinally extending edge conductors 24. Such an arrangement would not have the redundancy incorporated into the preferred embodiment and the card would be operable only by inserting the first side 2 up.

While the invention has been described with respect to specific embodiments, modifications and variations of the invention may be made without departing from the scope of the invention.

I claim:

1. Key card apparatus comprising: a circuit card stock having first and second sides, and having first and second longitudinally extending edges and first and second opposite end edges; a first series of spaced contacts mounted on the first side adjacent the first end edge and extending generally perpendicularly from the first end edge; a second series of spaced contacts mounted on the second side near the first end edge and extending generally perpendicularly from the first end edge; a first series of conductors respectively connected to the first series of contacts and extending inward therefrom on the first side towards the second end edge; means for commonly connecting the first series of conductors together; a second series of conductors respectively connected to the second series of contacts, the second series of conductors extending inward from the contacts on the second side of the card towards the second end edge, and then extending across the card between the first and second longitudinal edges and then extending longitudinally on the card toward the first end edge, the second series of conductors on the second side being spaced inwardly from the first and second longitudinally extending edges, and the second end edge a distance greater than corresponding portions of the first series of conductors on first side so as to leave a peripheral area through which holes may be punched to sever selected ones of the first series of conductors to incorporate a code into the card; connectors extending through the card from the first surface to the second surface for selectively connecting the first series of conductors to the second series of conductors thereby connecting the second series of contacts to the first series of contacts in reverse order so that the card is reversible; and means for interrupting selected conductors.

2. The key card apparatus of claim 1 further comprising first and second covers respectively connected to the first and second sides and to the first and second conductors thereon for covering the respective sides and connectors.

3. The key card apparatus of claim 1 wherein the second series of connectors are separate from each other.

4. The key card apparatus of claim 1 wherein one contact in each series is not connected.

5. The key card apparatus of claim 1 wherein the means for commonly connecting the first series of conductors together comprises first spaced end contacts mounted at opposite ends of the first series of contacts, near respective first and second longitudinally extending edges and further comprising longitudinally extending edge conductors extending along the longitudinally extending edges from the first spaced end contacts, the longitudinally extending edge conductors being connected to the first series of conductors, and wherein the longitudinally extending edge conductors are connected to each other.

6. The key card apparatus of claim 5 further comprising second end contacts positioned on the second side at ends of the second series of contacts near the first and second longitudinally extending edges.

7. The key card apparatus of claim 6 wherein the second end contacts are connected to the first end contacts by conductive means extending through the card from the first surface to the second surface.

8. Key card apparatus comprising: a printed circuit card having first and second opposite surfaces, first and second spaced side edges and first and second spaced end edges, the first and second side edges being connected to the first end edge by bevels, generally perpendicular to the first and second surfaces, the first end edge being beveled inward from opposite surfaces to form a knife-like first edge; a first series of parallel contacts connected to the first surface and extending perpendicularly inward thereon from adjacent the first end edge; first conductors connected to inward extremities of the first contacts and extending inward on the first surface towards the second end edge; means for commonly connecting the first series of conductors together; second contacts positioned on the second surface and extending inward on the surface from adjacent the first end edge; second conductors connected to the second contacts and extending inward on the second surface towards the second end edge the second conductors being spaced inwardly from the first and second side edges and the second end edge a distance greater than corresponding portions of the first conductors so as to leave a peripheral area through which holes may be punched to sever selected ones of the first conductors to incorporate a code into the card; connectors extending through the key card from the first surface to the second surface and connected to conductors on the first and second surfaces thereby connecting the second series of contacts to the first series of contacts in reverse order so that the card is reversible; first and second covers respectively positioned on the first and second surfaces and covering the conductors and connectors and partially covering ends of the contacts remote from the first end edge.

9. The key card apparatus of claim 8 wherein portions of the first conductors are laterally offset from overlying portions of the second conductors on the second surface, whereby connectors extending through the card selectively connect first conductors on the first side of the card with corresponding second conductors on the second side of the card the second conductors being in opposite sequential order so that the card can be inserted either side up.

10. The key card apparatus of claim 9 wherein the means for commonly connecting the first series of conductors together comprises first spaced end contacts mounted at opposite ends of the first series of contacts, near respective first and second longitudinally extending edges and further comprising longitudinally extending edge conductors extending along the longitudinally extending edges from the first spaced end contacts, the longitudinally extending edge conductors being connected to the first series of conductors, and wherein the longitudinally extending edge conductors are connected to each other.

11. The key card apparatus of claim 10 further comprising second end contacts positioned on the second side at ends of the second series of contacts near the first and second longitudinally extending edges.

12. The key card apparatus of claim 11 wherein the second end contacts are connected to the first end contacts by conductive means extending through the card from the first surface to the second surface.

13. The key card apparatus of claim 12 wherein several of the conductors are interrupted by holes punched through the card and punched through the selected conductors.

14. The key card apparatus of claim 13 wherein holes are punched through the card in portions of the first conductors near the longitudinally extending edge conductors.

15. The key card apparatus of claim 14 wherein the connectors are arranged in a V-shaped form having an apex pointing toward the second end of the card.

16. The key card apparatus of claim 15 wherein the first and second covers are flexible adhesive-backed covers adhesively connected to the first and second surfaces.

* * * * *